United States Patent [19]

van den Bungelaar et al.

[11] 4,338,573

[45] Jul. 6, 1982

[54] OUTPUT AMPLIFIER WITH NON-LINEAR NEGATIVE FEEDBACK

[75] Inventors: Martinus J. van den Bungelaar, Nijmegen; Albert Stoker, Eindhoven, both of Netherlands

[73] Assignee: U.S. Philips Corporation, New York, N.Y.

[21] Appl. No.: 132,471

[22] Filed: Mar. 19, 1980

[30] Foreign Application Priority Data

Mar. 20, 1979 [NL] Netherlands .......................... 7902160

[51] Int. Cl.³ .............................................. H03F 3/30
[52] U.S. Cl. .................................. 330/298; 330/207 P
[58] Field of Search ............... 330/110, 262, 270, 298, 330/207 P, 146

[56] References Cited

U.S. PATENT DOCUMENTS

| | | |
|---|---|---|
| 3,531,720 | 9/1970 | Visher . |
| 3,990,020 | 11/1976 | Porter .............................. 330/207 P |
| 4,006,428 | 2/1977 | Meyer et al. .................... 330/207 P |

FOREIGN PATENT DOCUMENTS 251625  2/1970  U.S.S.R. ............................. 330/262

*Primary Examiner*—James B. Mullins
*Assistant Examiner*—Gene Wan
*Attorney, Agent, or Firm*—Thomas A. Briody; William J. Streeter; Laurence A. Wright

[57] ABSTRACT

Short-circuit protection of the load of an output amplifier by means of a non-linear coupling between the output and a d.c. bias point of the amplifier.

7 Claims, 1 Drawing Figure

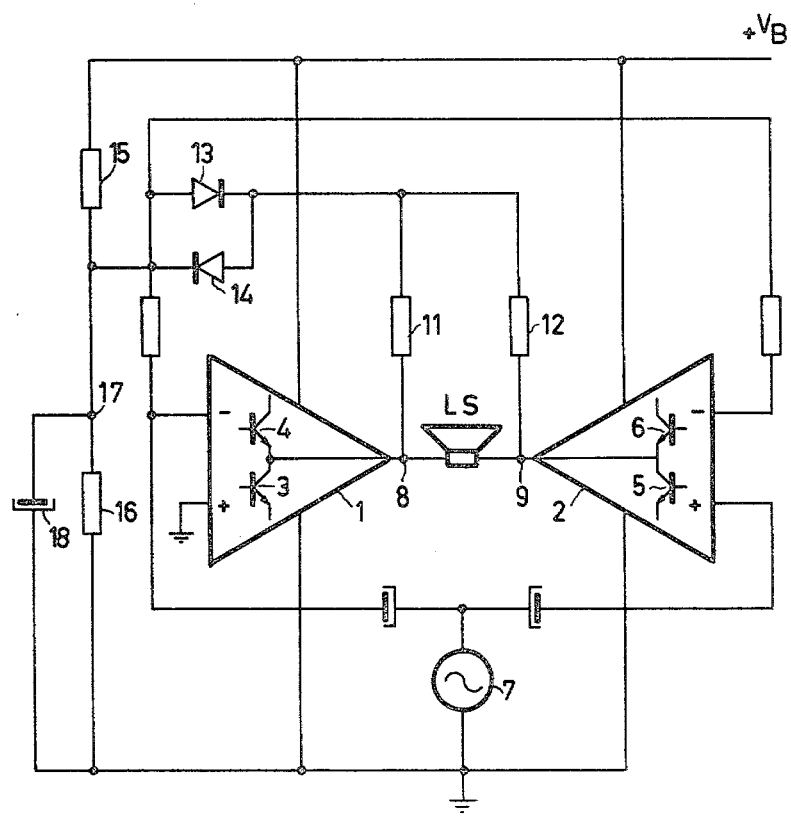

OUTPUT AMPLIFIER WITH NON-LINEAR NEGATIVE FEEDBACK

This invention relates to a circuit arrangement comprising an amplifier and having means to protect against overloading.

BACKGROUND OF THE INVENTION

In order to protect such circuit arrangements against overloading use is frequently made of non-linear negative feedback between the input and the output of the amplifier. As an example, U.S. Pat. No. 4,006,428 describes a circuit arrangement which, in order to avoid distortion, employs non-linear negative feedback, which enables the operating point of the amplifier to be shifted so that the amplifier always operates within the linear operating range. Swedish patent application No. 7301979-6, which has been laid open to public inspection, also reveals a similar step, the object being to prevent excess voltages from appearing on the amplifier, which would otherwise damage the amplifier.

The invention is concerned with a short-circuit protection problem. In this respect it is not so much of interest that excessive signal or operating voltages appear on the amplifier itself, but that an excessive current would flow through the load impedance to be connected to the amplifier, so that said load could be damaged.

Especially in output amplifiers for car radios this risk of short-circuiting is an essential problem. The relevant output amplifier generally takes the form of an integrated circuit with two amplifier sections operating in a bridge arrangement, between whose outputs a load, specifically a loudspeaker, is included. If owing to carelessness or wiring defects one of these outputs comes into contact with the metal parts of the car (earth), a direct current of several amperes could permanently flow through this loudspeaker, which loudspeaker is generally not capable of handling such current.

SUMMARY OF THE INVENTION

It is the object of the invention to provide a solution to this problem and the invention is characterized in that the arrangement comprises a second amplifier, the two amplifiers having a common input, being operated in push-pull and a load impedance being switchable between their outputs, a first direct-current passing circuit being included between the output of the first amplifier and a first d.c. bias point of the second amplifier and a second direct-current passing circuit being included between the output of the second amplifier and a second d.c. bias point of the first amplifier, in such a way that the resulting d.c. coupling from the output of the first amplifier to the output of the second amplifier or from the output of the second amplifier to the output of the first amplifier is non-inverting, and each of the direct-current passing circuits including a non-linear current-passing element.

BRIEF DESCRIPTION OF THE DRAWING

The invention is described in more detail with reference to the drawing, which shows an embodiment of the invention.

DESCRIPTION OF THE PREFERRED EMBODIMENT

The output amplifier comprises two sections, taking the form of high-power operational amplifiers 1 and 2, for example of the type TDA 1512 (Philips), or jointly accommodated in a semiconductor body as an integrated circuit. The operational amplifiers 1 and 2 may be provided in known manner with transistors 3, 4 and 5, 6, respectively to be connected in series to the power supply (totempole arrangement), which are driven in phase opposition by the signal from a source 7, so that in turn the transistors 3 and 6 or 4 and 5 simultaneously become more conductive (bridge drive). A load, specifically a loudspeaker LS, is or may be included between the outputs 8 and 9 of the operational amplifiers 1 and 2 respectively, so that the signal current flows through said load alternately in the one or in the other direction.

It may then be dangerous if one of the outputs 8 or 9 makes contact with earth. This will result in a direct current through the load LS, which it cannot withstand in the end. There is not only the risk that the loudspeaker coil will burn out, but the direct current may also cause said coil to be deformed permanently. In order to prevent this, in accordance with the invention, the outputs 8 and 9 of the amplifiers 1 and 2 are connected to a d.c. bias point of the amplifier, specifically the non-inverting inputs (−) of the amplifiers 1 and 2 via resistors 11 and 12 and a non-linear current-passing element, comprising two rectifiers 13 and 14 with a low internal threshold voltage connected in anti-parallel. By means of a voltage divider comprising the resistors 15, 16 these inputs are biased to a direct voltage which determines the d.c. bias voltage on the outputs 8 and 9. Generally half the supply voltage is selected for this voltage, because this allows a maximum drive of transistors 3, 4 and 5,6.

During normal operation the direct voltage on the connecting point 17 of the resistors 15, 16 and that on the outputs 8 and 9 will be equal, so that the rectifiers 13 and 14 are cut off. Generally this is achieved by comparing the output direct voltage (on points 8 and 9 respectively) with the input direct voltage (on point 17) in a comparator stage and deriving a negative feedback voltage from the difference, which feedback voltage corrects the output direct voltage so as to reduce said difference. (If the operational amplifier is of a type in which during normal operation a fixed difference exists between said direct voltages, a point where said direct voltage difference is zero may be determined by a suitable tapping on the potentiometer 15, 16). When the resistors 11 and 12 are selected to be equal, the same direct voltage, but now exempt from a.c. signal components, will be generated on their connecting point, in which case coupling capacitors, such as 18, may be dispensed with.

If one of the outputs 8 (or 9) is now connected to earth, the rectifier 13 will become conductive and bring point 17 at a corresponding potential, so that via the d.c. coupling in the amplifier 2 (and 1 respectively) the other output 9 (or 8) is also brought at the same potential and the risk of overloading LS is avoided.

Similarly, the risk that one of the outputs 8 or 9 comes into contact with the positive terminal ($+V_B$) of the supply voltage source, may be avoided by the inclusion of a rectifier 14 with an opposite forward direction in parallel with the rectifier 13. All these circuit elements 11 through 16 may be incorporated in the same integrated circuit as the operational amplifiers 1 and 2.

What is claimed is:

1. A circuit arrangement comprising:
a first amplifier, a second amplifier, said amplifiers having a common input and being operated in push-pull, a load impedance being switchable between the outputs of said amplifiers, a first direct-current passing circuit being included between the output of the first amplifier and a first d.c. bias point of the second amplifier, and a second direct-current passing circuit being included between the output of the second amplifier and a second d.c. bias point of the first amplifier, whereby the resulting d.c. coupling from the output of the first amplifier to the output of the second amplifier and from the output of the second amplifier to the output of the first amplifier is non-inverting, and each of the direct-current passing circuits includes a non-linear current-passing element.

2. A circuit arrangement as claimed in claim 1, wherein said non-linear current passing element takes the form of a rectifier.

3. A circuit arrangement as claimed in claim 1 or 2, wherein said non-linear current-passing element is constituted by two rectifiers connected in anti-parallel.

4. A circuit arrangement as claimed in claim 1, wherein each of the direct-current passing circuits comprises a resistor.

5. A circuit arrangement as claimed in claim 4, wherein said direct-current passing circuits are connected to a d.c. bias point which is common to the two amplifiers.

6. A circuit arrangement as claimed in claim 5, wherein said current passing element for each of the direct-current passing circuits is constituted by a single direct-current passing element which is common to the two direct-current passing circuits and the resistors are included between the outputs of the two amplifiers and said common direct-current passing element.

7. A circuit arrangement as claimed in claim 4, wherein said the resistors have equal resistance values.